(12) United States Patent
Yuferev et al.

(10) Patent No.: US 12,009,290 B2
(45) Date of Patent: Jun. 11, 2024

(54) SEMICONDUCTOR MODULE HAVING A MULTI-BRANCH SWITCH NODE CONNECTOR

(71) Applicant: Infineon Technologies Austria AG, Villach (AT)

(72) Inventors: Sergey Yuferev, Villach (AT); Robert Fehler, Regensburg (DE); Angela Kessler, Sinzing (DE); Gerhard Noebauer, Villach (AT); Petteri Palm, Stein (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/135,771

(22) Filed: Apr. 18, 2023

(65) Prior Publication Data
US 2023/0253304 A1    Aug. 10, 2023

Related U.S. Application Data

(63) Continuation of application No. 17/494,209, filed on Oct. 5, 2021, now Pat. No. 11,664,304.

(30) Foreign Application Priority Data

Oct. 7, 2020    (EP) ..................... 20200625

(51) Int. Cl.
*H01L 23/498*    (2006.01)
*H01L 23/538*    (2006.01)
*H01L 25/16*    (2023.01)

(52) U.S. Cl.
CPC ........ *H01L 23/49844* (2013.01); *H01L 25/16* (2013.01)

(58) Field of Classification Search
CPC ......... H01L 23/49844; H01L 23/49575; H01L 23/49562; H01L 23/49524; H01L 23/5381; H01L 23/5386; H01L 23/5389; H01L 25/16; H01L 25/165; H01L 25/072; H01L 24/24
See application file for complete search history.

(56) References Cited

U.S. PATENT DOCUMENTS

| | | | |
|---|---|---|---|
| 2008/0130330 A1* | 6/2008 | Tao ..................... | G01R 19/0092 363/123 |
| 2009/0039869 A1* | 2/2009 | Williams ................ | H01L 24/48 324/123 R |
| 2012/0025794 A1* | 2/2012 | Inoue .................... | H02M 3/158 323/271 |

(Continued)

FOREIGN PATENT DOCUMENTS

| | | |
|---|---|---|
| EP | 2916354 A2 | 9/2015 |
| EP | 2988328 A1 | 2/2016 |

*Primary Examiner* — Omar F Mojaddedi
(74) *Attorney, Agent, or Firm* — Murphy, Bilak & Homiller, PLLC

(57) ABSTRACT

A semiconductor module is provided that includes a low side switch, a high side switch and a control chip. The low side switch and the high side switch are arranged laterally adjacent one another and coupled by a switch node connector to form a half bridge circuit. The switch node connector includes two or more branches that have an arrangement with respect to the low side switch and to the high side switch and that each have a cross-sectional area.

20 Claims, 6 Drawing Sheets

(56) References Cited

U.S. PATENT DOCUMENTS

| | | | |
|---|---|---|---|
| 2015/0270249 A1* | 9/2015 | Cho | H01L 23/49575 257/329 |
| 2016/0006428 A1* | 1/2016 | Wang | H01L 23/552 327/109 |
| 2016/0079156 A1* | 3/2016 | Liu | H01L 23/3675 257/676 |
| 2016/0172279 A1* | 6/2016 | Cho | H01L 23/49575 257/676 |
| 2017/0345714 A1* | 11/2017 | Scharf | H01L 23/5384 |
| 2018/0122745 A1* | 5/2018 | Cho | H01L 23/5389 |
| 2021/0006240 A1* | 1/2021 | Schläfli | G01R 15/207 |

* cited by examiner

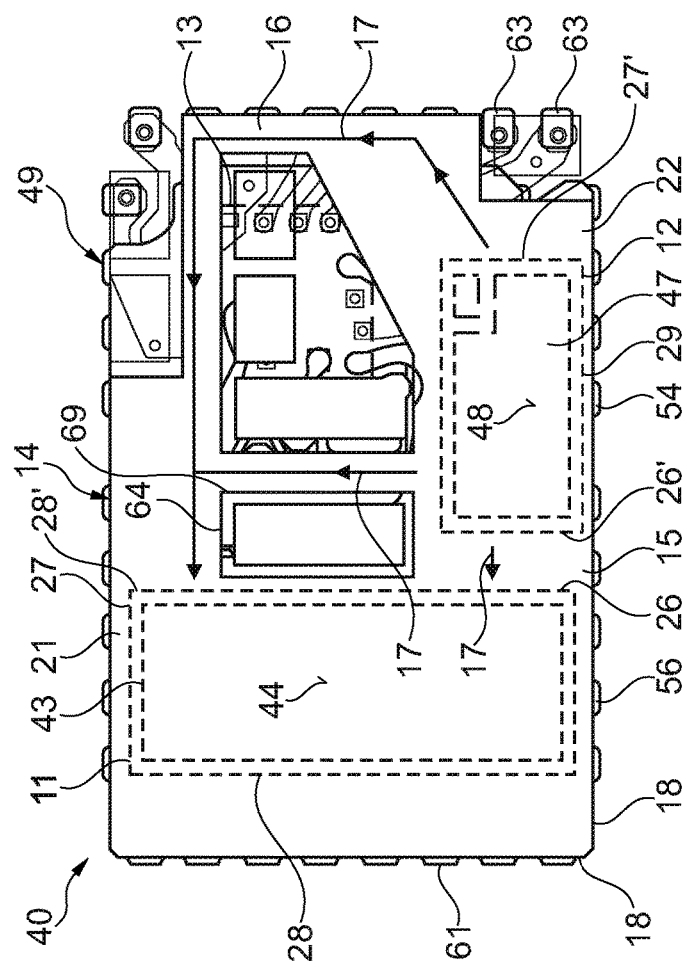
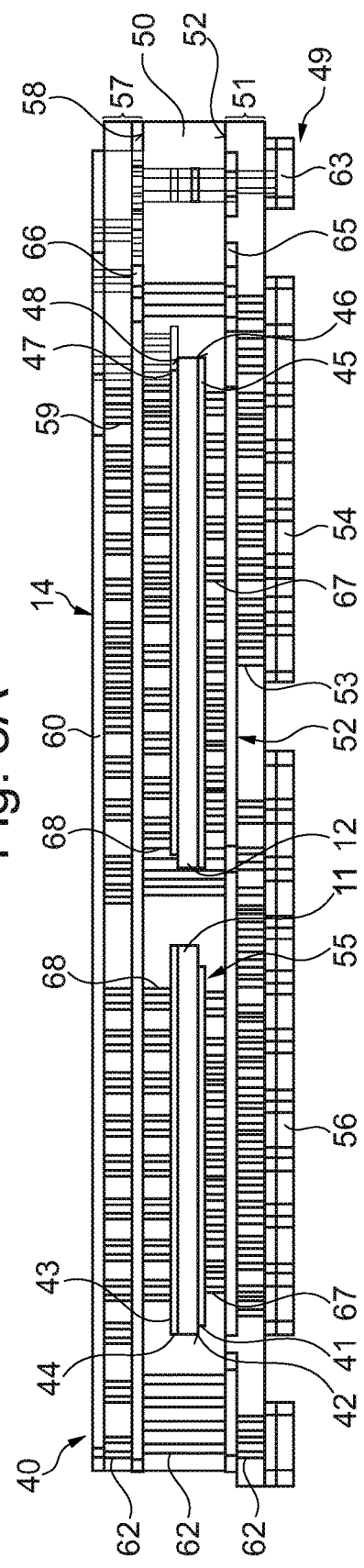
Fig. 3A
Fig. 3B

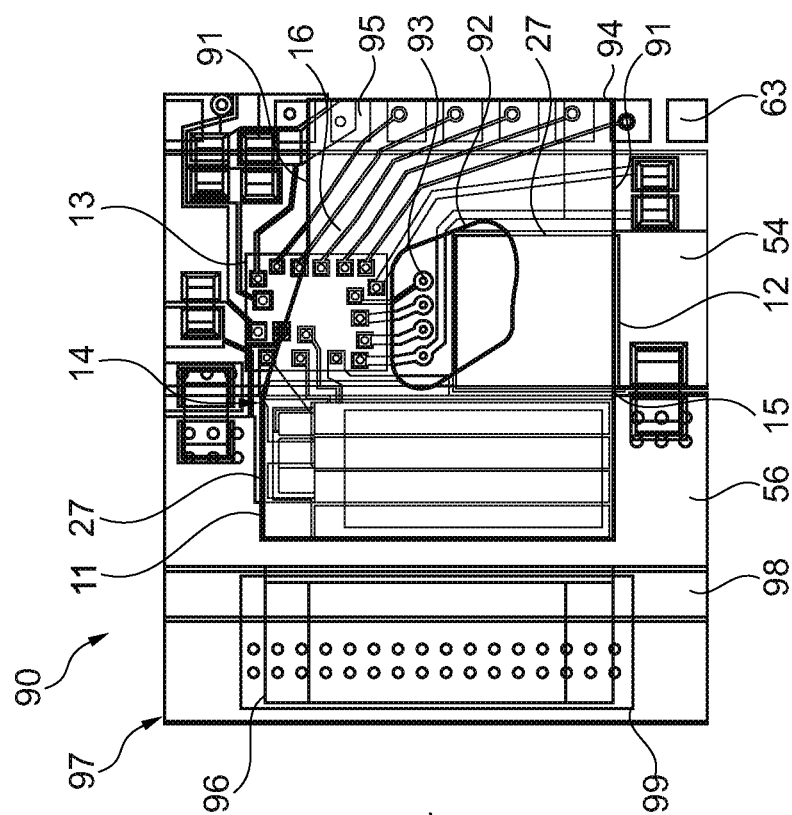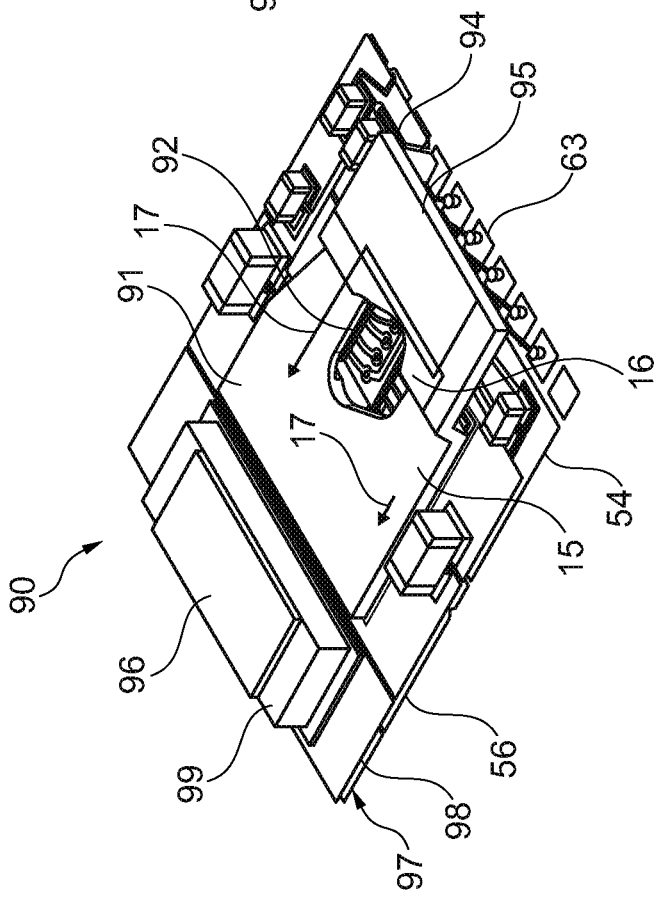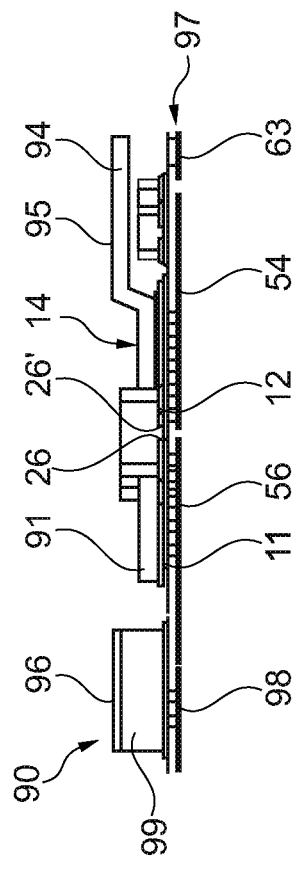

SEMICONDUCTOR MODULE HAVING A MULTI-BRANCH SWITCH NODE CONNECTOR

BACKGROUND

Transistors used in power electronic applications are typically fabricated with silicon (Si) semiconductor materials. Common transistor devices for power applications include Si CoolMOS®, Si Power MOSFETs, and Si Insulated Gate Bipolar Transistors (IGBTs). These transistor devices may be connected together to provide circuits or sections of circuits. For example, two transistor devices may be electrically connected to form a half-bridge circuit. Such circuits typically require control circuitry including gate driver circuitry which may be used to switch the transistors.

Two transistor devices coupled to form a half-bridge circuit and a device with control circuitry may be accommodated within a single semiconductor package which may be referred to as a power stage. Providing the connections between the devices in a package or module has some challenges due to the limited space available space within the package. EP 2 463 904 A2 discloses a multi-chip Power Quad Flat No-lead package in which a leadframe of the package is utilized for electrical interconnections. However, improvements to packages including more than one semiconductor device are desirable.

SUMMARY

According to the invention, a semiconductor module is provided that comprises a low side switch, a high side switch and a control chip. The low side switch and the high side switch are arranged laterally adjacent one another and coupled by a switch node connector to form a half bridge circuit. The switch node connector comprises two or more branches that have an arrangement with respect to the low side switch and to the high side switch and that each have a cross-sectional area. The arrangement and the cross-sectional area of the two or more branches are selected so as to homogenise the current density distribution within the switch node connector.

The arrangement of the branches includes their lateral shape and routing within the module, for example whether a branch has a direct route or an indirect route between the low side switch and the high side switch and, consequently, their length, as well as their position within the module in relation to the position of the low side switch and high side switch, e.g. the position of the two ends of each branch with respect to the low side switch and high side switch.

Due to the use of these two or more branches, the semiconductor module provides a power stage with a more homogeneous current flow in the switch node connection between the two transistor devices. This in turn can lead to a decrease of power losses and package resistance. In order to homogenise current flow and make it more uniform, low current density areas of the switch node connector are connected by an additional a "bridge" or secondary current path through the use of the two branches. The two paths and branches may be separated by an opening in the switch node connector to balance current flow and to make power loss density distribution more homogeneous. The two or more branches or conductive paths between different regions of the transistor devices assist in balancing and smoothing out non-homogeneous DC current distributions in the switch node connector which may occur as the high side switch is switched on and the low side is switched off and to remove hot spots in the DC power loss density distribution. Since non-uniformities in the current density distribution tend to increase with an increase in switching frequency due to the generation of eddy currents, the semiconductor module may be useful for devices with a driver frequency in the MHz range.

In some embodiments, the switch node connector comprises a first portion that is arranged on the low side switch, a second portion that is arranged on the high side switch and the two or more branches extend between the first portion and the second portion. The two or more branches are spaced apart from one another. In this embodiment, the first and second branches extend between the common first and second portions, which provide opposing distal portions of the switch node connector, and provide two separate conductors having different routes between the first and second portions and between the low side switch and the high side switch.

In some embodiments, the second branch has a cross-sectional area that is smaller than a cross-sectional area of the first branch and/or the second branch has a length that is greater than a length of the first branch. One of both of the cross-sectional area and the length of the branches may be adjusted so as to homogenise the current density distribution within the switch node connector.

The low side switch and the high side switch may each be provided by a transistor device. In some embodiments, the low side switch and the high side switch are each provided by a vertical transistor device. In some embodiments, the switch node connector extends between a drain pad of the low side switch and a source pad of the high side switch and the two or more branches are positioned between the drain pad of the low side switch and the source pad of the high side switch. The branches are, therefore, positioned within the module and extend laterally between the drain pad of the low side switch and the source pad of the high side switch.

In some embodiments, the switch node connector has the form of a conductive layer that comprises at least one aperture to form a first branch and a second branch that are physically spaced apart from one another.

A conductive layer may be used for a semiconductor module based on embedded chip techniques, in which the low side switch, high side switch and control chip are embedded in a common insulating layer. The conductive layer may be a deposited layer or be provided by a metallic foil layer that is supported on an insulating layer, for example a core layer comprises a reinforced thermosetting resin.

In some embodiments, the switch node connector has the form of a contact clip that comprises at least one aperture to form a first branch and a second branch that are physically spaced apart from one another. A contact clip may be used for a semiconductor module including a leadframe or redistribution substrate in which the low side switch, high side switch and control chip are mounted on portions of the leadframe or redistribution structure of the substrate.

In some embodiments, the aperture is positioned at least in part above the control chip. The entire lateral area of the control chip may be positioned within the aperture or regions of the switch node connector may be positioned above and overlap with the control chip. This arrangement may be useful if, for example, the control chip is connected by bond wires to a redistribution layer so that the additional height of the bond wires can be positioned within the aperture, and/or if the control chip has a greater thickness than the low side switch and the high side switch.

In some embodiments, the first and second branches extend around opposing lateral sides of the control chip.

In some embodiments, the low side switch and the high side switch each have a substantially cuboid form and are arranged laterally adjacent one another in a L-shape. This arrangement may be useful in providing a module with a small lateral size since the long sides of the cuboids can be arranged along two adjoining sides of the module. The control chip can be arranged in the remaining corner.

In some embodiments, the low side switch, the high side switch and the control chip are arranged laterally adjacent to one another such that they are substantially coplanar.

In some embodiments, the low side switch, the high side switch and the control chip are arranged laterally adjacent to one another such that a major surface of each of the low side switch, the high side switch and the control chip are substantially coplanar.

In some embodiments, the two or more branches are formed in a single layer, or the two or more branches extend in at least two layers that are connected by one or more conductive connections. The conductive connection may be a solder connection or a conductive via, for example. If two layers are used, the two layers may be arranged on opposing sides of the control chip or on the same side of the control chip, i.e. above or below the control chip.

In some embodiments, the control chip comprises gate driver circuitry and is coupled to a gate of the low side switch and a gate of the high side switch.

In some embodiments, the semiconductor module comprises a footprint comprising a $V_{high}$ pad, a $V_{low}$ pad, a switch node pad and one or more logic pads, wherein the switch node connector is coupled to the switch node pad of the semiconductor module.

In some embodiments, the low side switch and the high side switch are coupled in series between the $V_{low}$ pad and the $V_{high}$ pad of the semiconductor module by the switch node connector, and the switch node connector is positioned within the module.

In some embodiments, the low side switch and the high side switch are each provided by a vertical transistor device. In some embodiments, the low side switch comprises a source pad on a first side that faces towards the $V_{low}$ pad and a drain pad on a second side opposing the first side, wherein the drain pad of the low side switch is connected to the switch node connector. The high side switch comprises a source pad on a first side and a drain pad on a second side opposing the first side, wherein the drain pad of the high side switch faces towards the $V_{high}$ pad and the source pad of the high side switch is connected to the switch node connector.

The $V_{high}$ pad, the $V_{low}$ pad, the switch node pad and the one or more logic pads may be provided by portions of a leadframe. In these embodiments, the source pad of the low side switch is mounted on the $V_{low}$ pad and the drain pad of the high side switch is mounted on the $V_{high}$ pad of the leadframe.

In a semiconductor module fabricated using embedded chip technology, the $V_{high}$ pad, the $V_{low}$ pad, the switch node pad and the one or more logic pads may be formed on an insulating layer of the module that covers the low side switch, the high side switch and the control chip. The source pad of the low side switch may be connected to the $V_{low}$ pad by one or more conductive vias and the drain pad of the high side switch may be connected to the $V_{high}$ pad by one or more conductive vias.

In some embodiments, the vertical transistor device is a MOSFET (Metal Oxide Semiconductor Field Effect Transistor) device, an insulated gate bipolar transistor (IGBT) device or a Bipolar Junction Transistor (BJT).

The electrodes or terminals of the transistor device are referred to herein as source, drain and gate. As used herein, these terms also encompass the functionally equivalent terminals of other types of transistor devices, such as an insulated gate bipolar transistor (IGBT). For example, as used herein, the term "source" encompasses not only a source of a MOSFET device and of a superjunction device but also an emitter of an insulator gate bipolar transistor (IGBT) device and an emitter of a Bipolar Junction Transistor (BJT) device, the term "drain" encompasses not only a drain of a MOSFET device or of a superjunction device but also a collector of an insulator gate bipolar transistor (IGBT) device and a collector of a BJT device, and the term "gate" encompasses not only a gate of a MOSFET device or of a superjunction device but also a gate of an insulator gate bipolar transistor (IGBT) device and a base of a BJT device.

In some embodiments, the semiconductor module further comprises an inductor. In some embodiments, the inductor is an output inductor that is electrically coupled between the switch node connector and an output pad $V_{out}$. In these embodiments, the semiconductor module comprises a footprint comprising a $V_{high}$ pad, a $V_{low}$ pad, a $V_{out}$ pad and one or more logic pads.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 3A and 3B illustrate a plan view and a cross-sectional view, respectively, of a semiconductor module according to an embodiment.

FIGS. 5A to 5C illustrate a perspective view, a side view and a partially transparent plan view, respectively, of a semiconductor module according to an embodiment.

DETAILED DESCRIPTION

Figure 1:
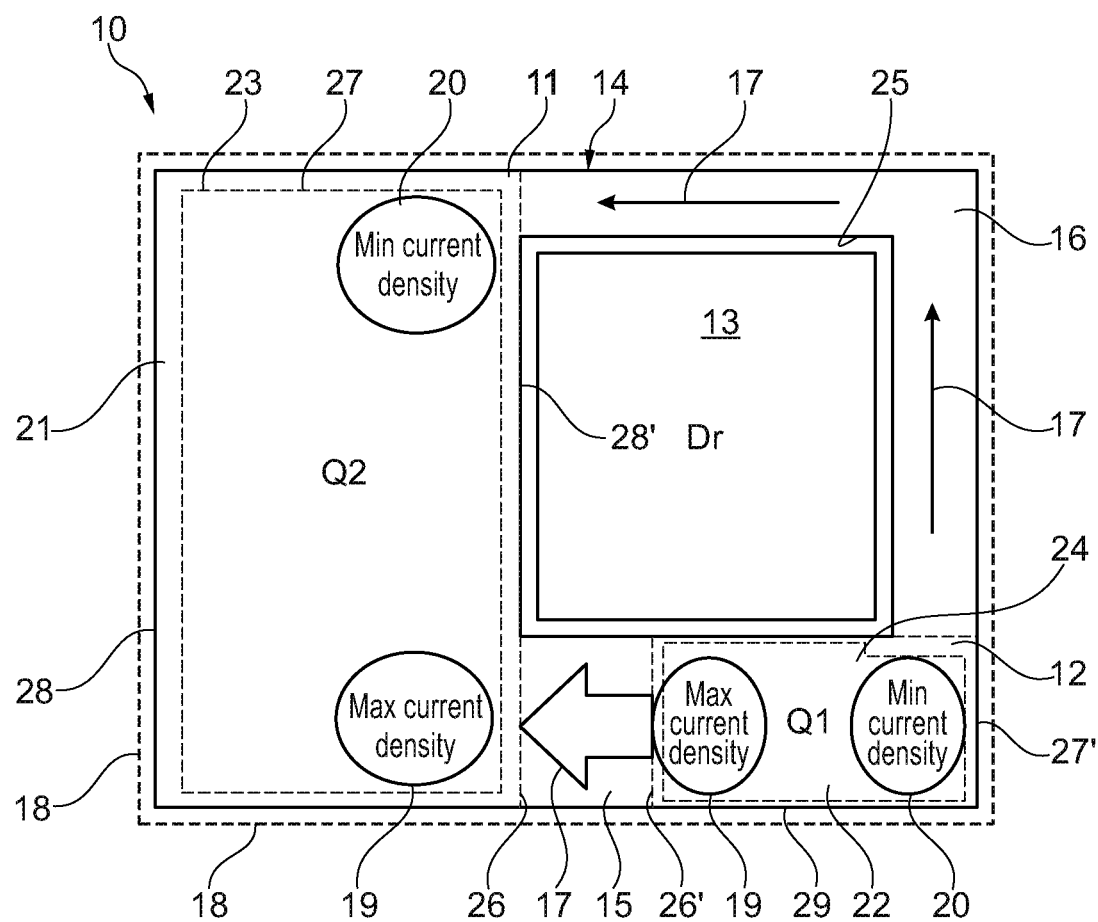
FIG. 1 illustrates a schematic plan view of a semiconductor module according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention addresses balancing current flow in integrated power stages, also referred to integrated power converters, for improvement of the electrical performance. An integrated power stage typically includes a half-bridge circuit including a low side switch and a high side switch and a control chip, commonly with driver circuitry for driving the high side switch and the low side switch. The power stage is commonly provided as a semiconductor module.

Continuous development of power semiconductor technologies resulting in the reduction of Rdson of the transistor devices providing the low side switch and the high side switch leads to the desire for further reduction of resistance of the power stage package in order to improve the overall efficiency, since the electrical resistance of the integrated power stage affects the conduction losses and, therefore, the total losses in the power stage. Some power stage modules have non-homogeneous current flow, for example in the switch node connection between the two transistor devices, which in turn can lead to an increase of power losses and package resistance. Some power stage modules have a non-symmetrical mutual position of the two transistor devices. This non-symmetrical mutual position may lead to non-homogeneous current flow, in particular in the switch node connection between the two transistor devices. Non-uniformities in the current density distribution tend to increase with an increase in frequency due to generation of eddy currents so that this negative effect is especially strong for devices with a driver frequency in MHz range.

According to the invention, in order to homogenise current flow and make it more uniform within the power stage, it is proposed to connect low current density areas of the transistor devices by a "bridge" or secondary current path in addition to the primary path. The primary path is typically the shortest path between the two transistors. This creates two paths in the switch node connection to balance current flow and to enable the power loss density distribution to become more homogeneous. The two branches or conductive paths between different regions of the transistor devices assist in balancing out and smoothing out non-homogeneous DC current distributions in the switch node connector for high side on-low side off switching and in removing hot spots in the DC power loss density distribution in the switch node connector.

This balancing approach focusses on mitigating the effects of eddy currents caused by switching that are expected to increase for higher frequency ranges. Additionally, the proposed design change has not been found to have any increase in the loop inductance.

This approach is suitable for modules fabricated using embedded chip technologies and for leadframe-based technologies such as PQFN like packages.

The secondary current path can be provided without any additional process steps or changes to the basic structure of the module. Depending on the design, the secondary current path for the current flow can be formed in different layers. One option is to route the secondary current path in same layer as the primary current path. If there is insufficient space to provide the routing for both paths in the same layer, the routing can also be done at least partially in the layer above the primary current path or in the layer under the primary current path, for example in core layer of an embedded chip package or on the layers on opposite sides of the die. Both performance and reliability of the module and the system is which it is used are improved. Additionally, there is no need to change the module footprint. The electrical performance of power stages, in particular an increase of efficiency as a result of reduction of electrical resistance, is provided.

FIG. 1 illustrates a schematic plan view of a semiconductor module 10 according to an embodiment. The semiconductor module 10 comprises a low side switch 11, also indicated with Q2, a high side switch 12, also indicated as Q1, and a control chip 13, also indicated by DR. The low side switch 11 and the high side switch 12 are layer arranged laterally adjacent one another and are coupled by a switch node connector 14 to form a half bridge circuit. The switch node connector 14 comprises two branches 15, 16 that have an arrangement with respect the low side switch 11 and to the high side switch 12 and which each have a cross-sectional area A1, A2, respectively. The arrangement and the cross-sectional area A1, A2 of the two branches 15, 16 are selected so as to homogenise the current density distribution within the switch node connector 14. The switch node connector 14 is used to carry current between the high side switch 12 and the low side switch 11, as is indicated in FIG. 1 by the arrows 17.

The arrangement of the branches 15, 16 includes their lateral shape and routing within the module 10, for example whether a branch has a direct route or an indirect route between the low side switch 11 and the high side switch 12 and, consequently, their length, as well as their position within the module 10 in relation to the position of the low side switch 11 and high side switch 12, e.g. the position of the two ends of each branch 15, 16 with respect to the low side switch 11 and high side switch 12.

In the semiconductor module 10 illustrated in FIG. 1, the low side switch 11 and the high side switch 12 each have a substantially cuboid form and are arranged laterally adjacent one another and spaced apart from one another to form an L-shape. A long side 28 of the low side switch 11 and a long side 29 of the high side switch are substantially parallel to two adjoining sides 18 of the module 10 which are substantially perpendicular to one another. This L shape may be thought of as a mutually asymmetric arrangement of the low side switch 11 and high side switch 12. Without taking further measures, the current density in the switch node connector 14 in the regions 19, which are directly adjacent the side faces 26, 26' of the low side switch 11 and high side switch 12 which face one another, would be much higher than in regions 20 of the switch node connector 14 which are positioned further from this border, for example, at the opposing side face 27 of the low side switch 11 and the opposing side face 27' of the high side switch 12, as is indicated schematically in FIG. 1 by the ellipses 19, 20.

In order to homogenise the current and provide a current density distribution within the switch node connector 14 which is more uniform such that the difference between the maximum current density regions 19 and minimum current density regions 20 is reduced or even eliminated, the switch node connector 14 is provided with two branches 15, 16 which are physically separate from one another and therefore provide two separate paths 17 for carrying the current between the high side switch 12 and the low side switch 11. The path 17 between the higher current density regions 19 provided by the first branch 15 may be denoted the primary path and the path 17 provided by the second branch 16 may be denoted as the secondary path.

In the embodiment illustrated in FIG. 1, the control chip 13 is positioned laterally adjacent the low side switch 11 and high side switch 12 such that it is positioned adjacent and spaced apart from the long sides of the switching low side switch 11 and high side switch 12. The first branch 15 of the switch node connector 14 extends adjacent one side of the control chip 13 and the second branch 16 extends around the two opposing side edges of the control chip 13.

The switch node connector 14 comprises a first portion 21 which is arranged on the low side switch 11 and a second portion 22 which is arranged on the high side switch 12. The two branches 15, 16 extend between the first portion 21 and the second portion 22 such that the switch node connector 14 has distal ends 21, 22 that are coupled by separate paths provided by the physically separate branches 15, 16. In this embodiment, the first branch 15 and the second branch 16 extend around the periphery of the control chip 13 so that the control chip 13 is uncovered by the switch node connector 14.

The first branch 15 extends between the two higher current density regions 19 and the second branch 16 extends between the two lower current density regions 20. In this embodiment, the second branch 16 has a cross-sectional area A2 which is smaller than the cross-sectional area A1 of the first branch 15. The cross-sectional area A1, A2 of the two branches 15, 16 and the ratio between the cross-sectional areas A1/A2 of each of branches 15, 16 may be selected so as to homogenise the current density within the two branches 15, 16 as well as in the first and second portions 21, 22 which are positioned directly on the low side switch 11 and high side switch 12. Alternatively, or in addition, the second branch 16 has a length which is greater than a length of the first branch 15.

In some embodiments, the low side switch 11 and the high side switch are each provided by a transistor device which is a vertical transistor device having a vertical drift path. In a vertical transistor device, the drain electrode is formed by a drain region at the rear surface. The source electrode and gate electrode are formed at the opposing front surface. The transistor device may be a MOSFET (Metal Oxide Semiconductor Field Effect Transistor) device, an insulated gate bipolar transistor (IGBT) device or a Bipolar Junction Transistor (BJT).

The electrodes or terminals of the transistor device are referred to herein as source, drain and gate. As used herein, these terms also encompass the functionally equivalent terminals of other types of transistor devices, such as an insulated gate bipolar transistor (IGBT). For example, as used herein, the term "source" encompasses not only a source of a MOSFET device and of a superjunction device but also an emitter of an insulator gate bipolar transistor (IGBT) device and an emitter of a Bipolar Junction Transistor (BJT) device, the term "drain" encompasses not only a drain of a MOSFET device or of a superjunction device but also a collector of an insulator gate bipolar transistor (IGBT) device and a collector of a BJT device, and the term "gate" encompasses not only a gate of a MOSFET device or of a superjunction device but also a gate of an insulator gate bipolar transistor (IGBT) device and a base of a BJT device.

The switch node connector 14 extends between a drain pad 23 of the low side switch 11 and a source pad 24 of the high side switch 12 to connect the low side switch 11 and the high side switch 12 in series. Consequently, the first portion 21 of the switch node connector 14 is positioned on the drain pad 23, the second portion 22 is positioned on the source pad 24 and the two branches 15, 14 extend between the drain pad 23 of the low side switch 11 and the source pad 24 of the high side switch 12 and within the module 10.

In some embodiments, the switch node connector 14 has the form of a conductive layer which comprises at least one aperture 25 in order to form the first branch 15 and the second branch 16. In the embodiment illustrated in FIG. 1, the aperture 25 has a lateral size and shape and is positioned such that the control chip 13 is positioned entirely within the aperture 25. A switch node connector 14 in the form of the conductive layer may be usefully used in semiconductor modules having based on embedded chip technology and having a laminated structure in which the low side switch 11, high side switch 12 and control chip 13 are embedded within an insulating layer and arranged within the common insulating layer laterally adjacent one another.

In some embodiments, the switch node connector 14 has the form of the contact clip which comprises at least one aperture 25 to form the first branch 15 and the second branch 16 that are physically spaced apart from one another. A switch node connector 14 in the form of a contact clip may be useful for semiconductor modules using a leadframe-based technology, for example.

Figure 2:
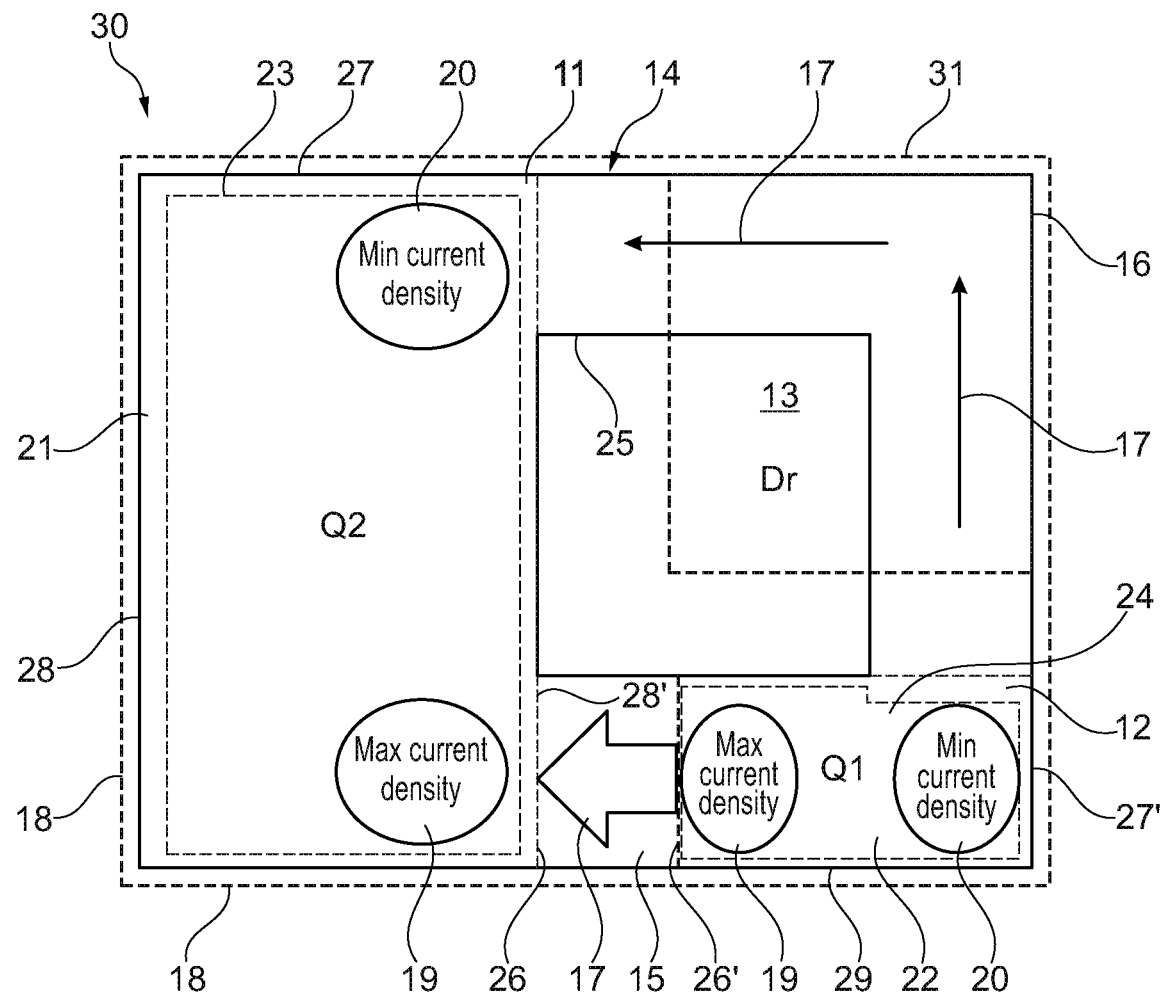
FIG. 2 illustrates a schematic plan view of a semiconductor module according to an embodiment.

FIG. 2 illustrates a schematic plan view of a semiconductor module 30 according to an embodiment. This embodiment varies in the position of the second branch 16 of the switch node connector 14 in relation to the position of the control chip 13. In this embodiment, an L-shaped second branch 16 is provided that extends between the side faces 27, 27' of the low side switch 11 and high side switch 12 that are positioned in diagonally opposing corners of the module 20 and adjacent the low density regions 20 as in the embodiments described with reference to FIG. 1. The second branch 16 and, therefore, the switch node connector 14 is positioned partly above two adjoining edges of the control chip 13 such that only a corner of the control chip 13 remains uncovered by the second branch 16 and the switch node connector 14 and such that the switch node connector 14 and, in particular, the second branch 16 partially overlaps with control chip 13. The aperture 25 in the switch node connector 14 is positioned above only a part of the area of the control chip 13. In this embodiment, the second branch 16 is illustrated as having a larger cross-sectional area A2 than in the embodiment illustrated in FIG. 1. Therefore, the ratio of the cross-sectional areas of the branches 15, 16, i.e. A1/A2, of the embodiment of FIG. 2 is lower than in the embodiment illustrated in FIG. 2.

In the semiconductor module 30, the control chip 13 is positioned at a peripheral edge of the semiconductor module 30 is indicated by the dotted line 31.

FIGS. 3A and 3B illustrate a plan view and a cross-sectional view, respectively, of a semiconductor module 40 according to an embodiment. The semiconductor module 40 includes a low side switch 11, a high side switch 12 and a control chip 13. The low side switch 11, the high side switch 12 and the control chip 13 are arranged laterally adjacent to one another. The low side switch 11 and the high side switch 12 each have a substantially cuboid form and are arranged such that the long side 28 of the low side switch 11 and the long side 29 of the high side switch 12 are positioned substantially parallel to adjoining sides 18 of the module 18 and such that the short side 26' of the high side switch 12 is substantially parallel to the long side 28' of the low side switch 11 such that an L shape is formed in plan view.

The low side switch 11 and the high side switch 12 are each formed by a vertical transistor device. The low side switch 11 includes a source pad 41 on its lower side 42 and also a gate pad on its lower side 42 which cannot be seen in the cross-sectional view of FIG. 3B, and a drain pad 43 on its upper side 44. The high side switch 12 includes a drain pad 45 on its lower side 46 and a source pad 47 and a gate pad, which cannot be seen in the cross-sectional view, on its upper side 48. The low side switch 11 and the high side switch 12 are arranged substantially coplanar to one another such that the lower surfaces 42, 40 face towards the lower surface 70 of the semiconductor module 40. The lower surface 70 provides the footprint including the outer contact surfaces 49 of the semiconductor module 40.

The semiconductor module 40 has a laminated structure fabricated using embedded chip technology such that the low side switch 11, the high side switch 12 and the control chip 13 are embedded in a core insulating layer 50. The semiconductor module 40 includes a first redistribution layer 51 which is positioned on the lower surface 52 of the insulating core layer 50. The first redistribution layer 51 includes an insulating layer, a lateral conductive layer 49 and conductive vias 53 that extend through the insulating layer. The conductive layer provides the outer contact surfaces 49. The first redistribution layer comprises a first conductive redistribution structure 52 including conductive vias 53 and which extends between the drain pad 45 and the $V_{high}$ pad 54 of the semiconductor module 40. The first redistribution layer 51 also includes a second redistribution structure 55 which includes conductive vias 53 and which extends between the source pad 42 and the $V_{low}$ contact pad 56 on the lower surface of the first redistribution layer 51. The first redistribution layer 51 also includes a further conductive redistribution structure for each of the gate pads and a further conductive redistribution structure between the control chip 13 and the logic pads 63 of the module 40.

The semiconductor module 40 also includes a second redistribution layer 57 positioned on an upper surface 58 of the insulating core layer 50 which is used to form the switch node connector 14 which extends between the source pad 47 of the high side switch 12 and the drain pad 43 of the low side switch 11. The second redistribution layer 57 includes an insulating layer, a lateral conductive layer 60 and conductive vias 59 that extend through the insulating layer. In this embodiment, the switch node connector 14 also includes the conductive vias 59 which extend through the second redistribution layer 57 and between the substantially planar conductive layer 60 to electrically couple the source pad 47 of the high side switch 12 and the drain pad 43 of the low side switch 11. The switch node connector 14 is also connected to a switch node pad $V_{sw}$ 61 positioned on the lower surface 70 of the semiconductor module 40 by one or more conductive vias which extend between the conductive layer 60 through the first and second redistribution layers 51, 57 and the insulating core layer 50.

The semiconductor module 40 also includes a plurality of logic pads 63 which are positioned on the lower surface of the module 40 and which are electrically connected to the control chip 13. Some of the logic pads 63 may also provide sense function is for the low side switch 11 and/or high side switch 12.

In some embodiments, one or both of the first and second redistribution layers 51, 57 has a multilayer redistribution structure including more than one horizontal lateral conductive layer.

As can be seen in the plan view of FIG. 3A, the planar conductive layer 60 of the switch node connector 14 includes two branches 15, 16 which extend around opposing sides of an aperture 25 which is positioned above the control chip 13. The control chip 13 is partially uncovered by the switch node connector 14 in this embodiment. The first and second branches 15, 16 extend between a common second portion 22 which is positioned on the high side switch 12 and a common first portion 21 which is connected on the low side switch 11. The width and the cross-sectional area of the second branch 16 is smaller than the width and consequently cross-sectional area of the first branch 15. In this embodiment, the switch node connector 14 and conducive layer 60 also includes a further aperture 64 in which an inductor may be positioned.

In some embodiments, a portion of the rewiring structure between the outer contact pads 49 and the low side switch 11, the high side switch 12 and the switch node connector 14 is formed on the insulating core layer 50. For example, the insulating core layer 50 may be provided by a reinforced thermosetting resin, as is commonly used for the core layer of a printed circuit board and which includes conductive layers 65, 66 formed of metallic foil positioned on the two opposing surfaces, 52, 58. These conductive layers 65, 66 can be patterned to form part of the redistribution structure, for example between the source pad 41 of the low side switch 11 and the $V_{low}$ pad 56 and between the drain pad 45 of the high side switch 12 and the $V_{high}$ pad 54. Further conductive vias 67 are positioned between this conductive layer 65 and the respective pad 41, 45 of the low side switch 11 and high side switch 12. Similarly, the conductive layer 66 positioned on the opposing surface 58 of insulating core layer 50 may form part of the conductive redistribution structure of the switch node connector 14 with further conductive vias 68 being positioned between this lateral conductive layer 66 and the source pad 47 of the high side switch 12 and between the conductive layer 66 and the drain pad 43 of the low side switch 11.

The two branches 15, 16 provide two routes for carrying current between the source pad 47 and the drain pad 43. The first route is provided by the first branch 15 which extends directly between the side faces 26, 26' of the high side switch 12 and the low side switch 11 that face one another. The second branch 16 provides a second route which initially extends from the high side switch 12 in a direction away from the low side switch 11 and which forms a loop around the periphery of the control chip 13 to provide a conductive connection between the two diagonally opposing ends of the high side switch 12 and the low side switch 11. This arrangement of the two branches 15, 16 is used to homogenise the current distribution within the switch node connector 14.

The secondary current path provided by the second branch 16 between the switch node pad 61 and the $V_{high}$ pad 54 is used to balance current density distributions, reduce conduction and overall resistance of the device. For this type of module 40, simulations indicate that conduction losses at a 2 MHz driver frequency and 15% duty cycle may be reduced by 2.3% and 3.4% over an arrangement without the second branch 16 and having only a single current path provided by the first branch 15.

The aperture 64 for the inductor may be positioned laterally between the low side switch 11 and the control chip 13 and is spaced apart from the aperture 25 positioned above the control chip 13. Therefore, in this embodiment, switch node connector 14 can be considered to include a third branch 69 which extends between the second portion 21, which is common to all three branches 15, 16, 69 and positioned on the high side switch 12, and the first portion 21 positioned on the low side switch 11, which is common to all three branches 15, 16, 69. Three conductive paths 17 which are extend in differing directions are provided between the source pad 47 of the high side switch 12 and the drain pad 43 of the low side switch 11.

Figure 4:
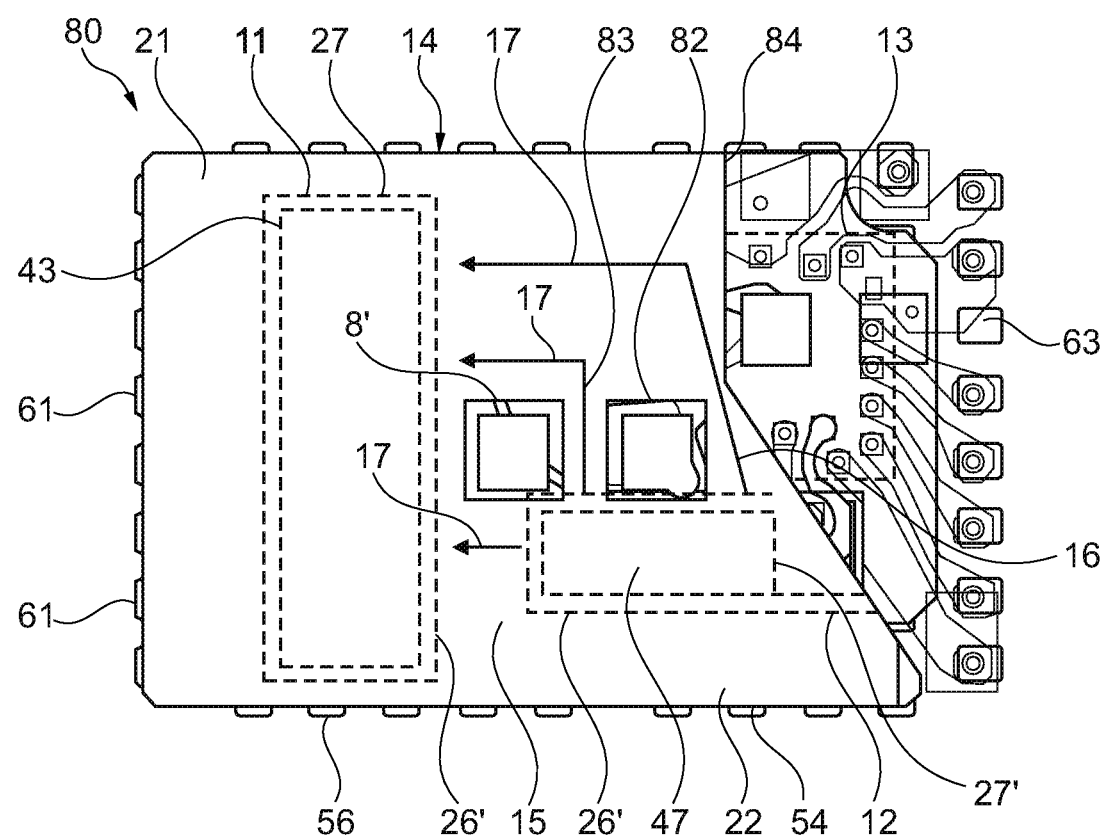
FIG. 4 illustrates a plan view of a semiconductor module according to an embodiment.

FIG. 4 illustrates a plan view of a semiconductor module 80 according to an embodiment. In this embodiment, the switch node connector 14 includes two apertures 81, 82 which are positioned laterally adjacent the high side switch 12 and the low side switch 11 and which each reveal a contact pad for a capacitor. In this embodiment, the switch node connector 14 and, in particular, the lateral conductive layer 60 has a lateral form such that a part or all of the control chip 13 is positioned laterally adjacent the periphery 84 of the switch node connector 14.

The second branch 16 is formed between the second aperture 82 and the periphery 84 of the conductive layer 60. The second branch 16 is positioned partially above the control chip 13 and between the control chip 13 and the low side switch 11 and high side switch 12. The second branch 16 is position on the same side of the control chip 13 as the high side switch 12 and low side switch 11 rather than being positioned on the opposing side of the control chip 13 as in the embodiments illustrated in FIGS. 1 to 3B.

The switch node connector 14 includes three branches 15, 16, 83 between the second portion 22 positioned on the source pad 47 of the high side switch 12 and the first portion 21 positioned on the drain pad 43 of the low side switch 11. The second branch 16 extends between the two diagonal outermost portions, i.e. the side faces 27, 27', of the high side switch 12 and low side switch 11 and, therefore, provides a further path 17 in addition to the shortest path 17 of the first branch 15 which extends directly between the side faces 26, 26' of the high side switch 12 and low side switch 11 that face one another. The third branch 83 extends between the two apertures 81, 82 and from second portion 22 positioned on the source pad 47 of the high side switch 12 and the first portion 21 positioned on the drain pad 43 of the low side switch 11. The third branch 83 provides an additional path 17 that is positioned between the paths 17 of the first and second branches 15, 16.

FIGS. 5A to 5C illustrate a perspective view, a side view and a partially transparent plan view, respectively, of a semiconductor module 80 according to an embodiment.

The semiconductor module 90 includes a low side switch 11, a high side switch 12 and a control chip 13 arranged laterally adjacent to one another and a switch node connector 14 which extends between the high side switch 12 and the low side switch 11.

In some embodiments, the semiconductor module including a switch node connector 14 with two or more branches is fabricated using embedding techniques for packaging the low side switch 11, the high side switch 12 and the control chip 13. However, the semiconductor module may also be fabricated using other packaging techniques such as leadframe-based techniques.

The semiconductor module 90 illustrated in FIGS. 5A to 5C is based on a leadframe 97 design, whereby portions of the leadframe 97 provide the $V_{high}$ pad 54, the $V_{low}$ pad 56, the switch node pad 61 and one or more logic pads 63. The source of the low side switch 11 is mounted on and electrically connected to the $V_{low}$ pad 56 and the drain of the high side switch 12 is mounted on and electrically connected to the $V_{high}$ pad 54, for example using solder or electrically conductive adhesive. The control switch 13 is mounted on a die pad which may provide an outer pad of the module or may be positioned within the module.

In this embodiment, the semiconductor module 90 includes a switch node connector 14 that is provided by a contact clip 91. The contact clip 91 is formed of freestanding member formed from a metal or alloy, typically copper or copper-based alloy. The switch node connector 14 in the form of the contact clip 91 includes an aperture 92 which is positioned so that when mounted in the module 90 the aperture 92 is at least partially positioned above the control chip 13 and provides two branches 15, 16 which extend between the high side switch 12 and the low side switch 11. A first branch 15 extends directly between the side faces 26, 26' of the high side switch 12 and the low side switch 11 and a second branch 16 extends around the aperture 92 on the opposing sides of the aperture 92 between the opposing side faces 27, 27' that are arranged in diagonally opposing corners of the module 90.

In this embodiment, the connections 93 to the control chip 13 are positioned within the aperture of the switch node connector 14. The conductive clip 91 also includes an extension 94 that its opposing side which has a raised leg such that the portion of the second branch 16 may be positioned above other components of the semiconductor module 90. In some embodiments, the switch node connector 14 is connected to a switch node pad. In some embodiments, the module 90 also includes an output inductor that is coupled between the switch node connector 14 and a $V_{out}$ pad.

The semiconductor module 90 further includes pads 95, 96 onto which the output inductor, not illustrated in FIGS. 5A to 5C, can be mounted. The pad 95 is positioned on the upper surface of the contact clip 91 providing the switch node connector 14 and is positioned on the extension 94. The pad 96 is positioned on a pedestal 99 arranged adjacent the outwardly facing long side of the low side switch 11. The pedestal 99 is arranged on the $V_{out}$ pad 98. In the mounted position, one end of the output inductor is connected to the pad 95 on the switch node connector 14 and the other end is connected to the $V_{out}$ pad 98. The $V_{out}$ pad 98 may in turn be connected to a load which receives power from the semiconductor module 90. The pedestal 99 and extension 94 enable the output inductor to be mounted above the high side switch 12, the low side switch 11 and the control chip 11.

Figure 6:
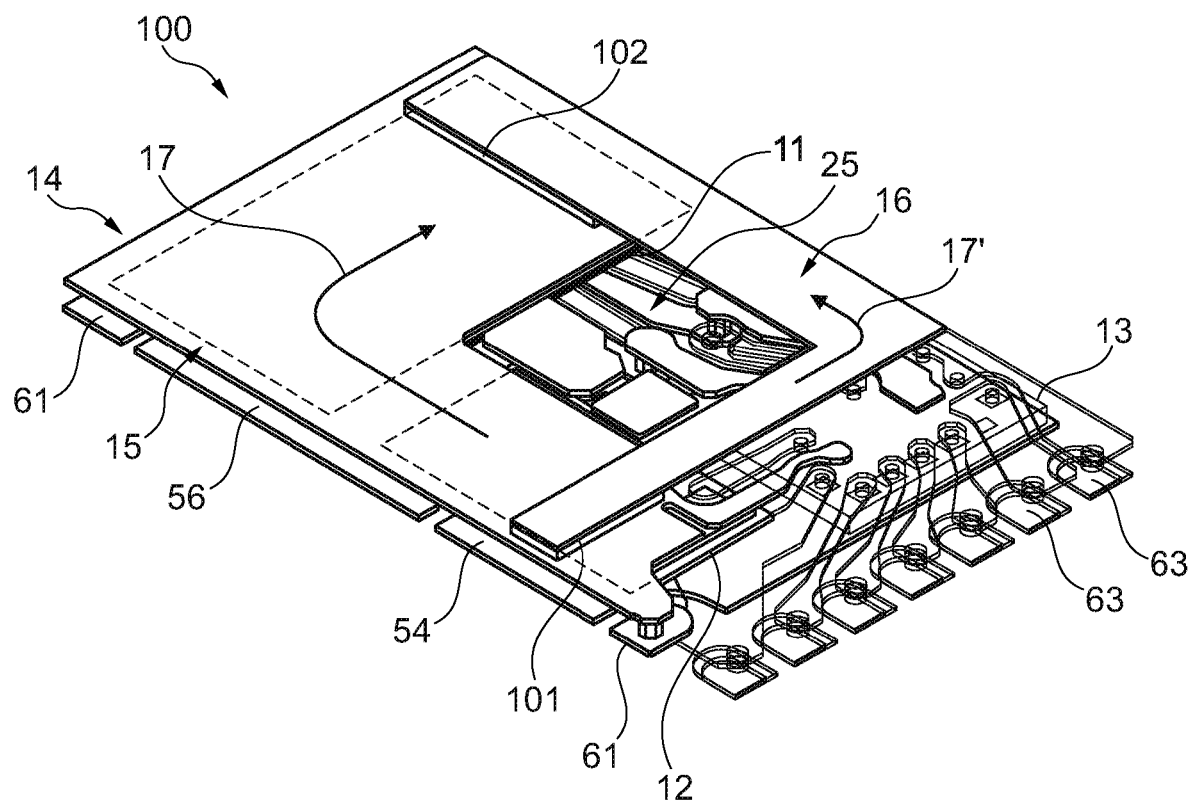
FIG. 6 illustrates a perspective view of a semiconductor module according to an embodiment.

FIG. 6 illustrates a perspective view of a semiconductor module 100 according to an embodiment. The semiconductor module 100 has an arrangement of the low side switch 11, high side switch 12 and control chip 13 that is similar to that illustrated in FIGS. 1 and 2. In this embodiment, the switch node connector 14 has two branches 15, 16 that are provided by separate discrete elements and that extend in two different layers. These layers are arranged at different vertical distances from the major surface of the leadframe 97. Each of the branches 15, 16 may be, for example, provided by a conductive layer or metal foil.

The first branch 15 has a L-form and is positioned in the lower of the two layers. The first branch 15 is positioned on and electrically connected to the source of the high side chip 12 at a first distal end and to the drain of the low side switch at a second distal end. The second branch 16 also has a L shape and is laterally positioned with respect to the first branch 15 such that an aperture 25 is formed between the two L-shapes that is positioned at least partly above the control chip 13. The second branch 16 is positioned on and above the first branch 15. A first distal end of the second branch 16 is positioned on the first branch 15 above the high side switch 12 and a second distal end of the second branch 16 is positioned on the first branch 15 above the low side switch 11.

The second branch 16 is therefore positioned above the first branch 15 to form a stack so that the first branch 15 is positioned between the switches and the second branch 16. In other embodiments, the vertical arrangement of the branches 15, 16 may be reversed so that the second branch 16 is arranged between the switches and the first branch 15. Both of the branches 15 and 6 of the switch node connector 14 are arranged on the same side of the control chip 13 but in different planes vertically above the control chip 13. In other non-illustrated embodiments, the two branches 15, 16 may be arranged in planes that are positioned on opposing sides of, i.e. above and below, the control chip 13.

The two branches 15, 16 are connected by conductive connections 101, 102 that extend vertically between the two layers. The conductive connections 101, 102 may be formed by solder or one or more conductive vias, for example. A solder connection may be used for semiconductor modules fabricated using leadframe-based packaging techniques and a conductive via may be used for semiconductor modules fabricated using embedding packaging techniques. The arms of the L-shaped second branch 16 have a smaller width than the arms of the L-shaped first branch 17 so that the second branch 16 provides a second current carrying path 17' and the first branch 15 provides the primary current carrying path 17 within the switch node connector 14.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module, comprising:
a low side switch;
a high side switch; and
a control chip;
wherein the low side switch and the high side switch are arranged laterally adjacent one another and coupled by a switch node connector to form a half bridge circuit, wherein the switch node connector comprises two or more branches that have an arrangement with respect to the low side switch and to the high side switch and that each have a cross-sectional area.

2. The semiconductor module of claim 1, wherein the switch node connector comprises a first portion that is arranged on the low side switch, a second portion that is arranged on the high side switch, wherein the two or more branches extend between the first portion and the second portion, and wherein the two or more branches are spaced apart from one another.

3. The semiconductor module of claim 1, wherein a second branch of the two or more branches has a cross-sectional area that is smaller than a cross-sectional area of a first branch of the two or more branches.

4. The semiconductor module of claim 1, wherein the switch node connector extends between a drain pad of the low side switch and a source pad of the high side switch, and wherein the two or more branches are positioned between the drain pad of the low side switch and the source pad of the high side switch.

5. The semiconductor module of claim 1, wherein the switch node connector has a form of a conductive layer that comprises at least one aperture to form a first branch and a second branch that are physically spaced apart from one another.

6. The semiconductor module of claim 5, wherein the at least one aperture is positioned at least in part above the control chip.

7. The semiconductor module of claim 5, wherein the first and second branches extend around opposing sides of the control chip.

8. The semiconductor module of claim 1, wherein the switch node connector has a form of a contact clip that comprises at least one aperture to form a first branch and a second branch that are physically spaced apart from one another.

9. The semiconductor module of claim 8, wherein the at least one aperture is positioned at least in part above the control chip.

10. The semiconductor module of claim 8, wherein the first and second branches extend around opposing sides of the control chip.

11. The semiconductor module of claim 1, wherein the low side switch and the high side switch each have a substantially cuboid form and are arranged laterally adjacent one another in an L-shape.

12. The semiconductor module of claim 1, wherein the two or more branches are formed in a single layer.

13. The semiconductor module of claim 1, wherein the control chip comprises gate driver circuitry and is coupled to a gate of the low side switch and a gate of the high side switch.

14. The semiconductor module of claim 1, wherein the semiconductor module has a footprint comprising a $V_{high}$ pad, a $V_{low}$ pad, a switch node pad and one or more logic pads, and wherein the switch node connector is coupled to the switch node pad of the semiconductor module.

15. The semiconductor module of claim 14, wherein the low side switch and the high side switch are coupled in series between the $V_{low}$ pad and the $V_{high}$ pad of the semiconductor module by the switch node connector, and wherein the switch node connector is positioned within the semiconductor module.

16. The semiconductor module of claim 14, wherein the low side switch comprises a source pad on a first side that faces towards the $V_{low}$ pad and a drain pad on a second side opposing the first side, wherein the drain pad is connected to the switch node connector, wherein the high side switch comprises a source pad on a first side and a drain pad on a second side opposing the first side, wherein the drain pad of the high side switch faces towards the $V_{high}$ pad and the source pad is connected to the switch node connector.

17. The semiconductor module of claim 1, wherein the low side switch and the high side switch are each provided by a vertical transistor device.

18. The semiconductor module of claim 1, wherein a second branch of the two or more branches has a length that is greater than a length of a first branch of the two or more branches.

19. The semiconductor module of claim 1, wherein the two or more branches extend in at least two layers that are connected by one or more conductive connections.

20. The semiconductor module of claim 1, wherein the two or more branches each provide a route for carrying current between the low side switch and the high side switch.

* * * * *